United States Patent [19]
Cheng et al.

[11] Patent Number: 5,545,575
[45] Date of Patent: Aug. 13, 1996

[54] METHOD FOR MANUFACTURING AN INSULATED GATE SEMICONDUCTOR DEVICE

[75] Inventors: Shih K. Cheng, Scottsdale, Ariz.; Marius Orlowski, Austin, Tex.

[73] Assignee: Motorola, Inc., Schaumburg, Ill.

[21] Appl. No.: 328,312

[22] Filed: Oct. 24, 1994

[51] Int. Cl.⁶ .................................................. H01L 21/265
[52] U.S. Cl. ................................. 437/40; 437/44; 437/41; 437/45; 437/27
[58] Field of Search .................................. 437/40, 41, 44, 437/45, 46, 40 AS, 40 GS, 40 SW, 41 RLD, 41 AS, 41 GS, 41 SW, 27

[56] References Cited

U.S. PATENT DOCUMENTS

| | | | |
|---|---|---|---|
| H,000,986 | 11/1991 | Codella et al. | 437/44 |
| 4,949,136 | 8/1990 | Jain | 257/344 |
| 4,968,639 | 11/1990 | Bergonzoni | 437/57 |
| 5,036,019 | 7/1991 | Yamane et al. | 437/44 |
| 5,082,794 | 1/1992 | Pfiester et al. | 437/40 SW |
| 5,158,903 | 10/1992 | Hori et al. | 437/44 |
| 5,162,884 | 11/1992 | Liou et al. | 437/41 GS |
| 5,171,705 | 12/1992 | Choy | 437/41 |
| 5,182,619 | 1/1993 | Pfiester | 257/382 |
| 5,202,276 | 4/1993 | Malhi | 437/41 |
| 5,227,321 | 7/1993 | Lee et al. | 437/44 |
| 5,248,627 | 9/1993 | Williams | 437/45 |
| 5,266,508 | 11/1993 | Azuma et al. | 437/44 |
| 5,372,960 | 12/1994 | Davies et al. | 437/44 |
| 5,427,964 | 6/1995 | Kaneshiro et al. | 437/41 AS |
| 5,445,980 | 8/1995 | Komori et al. | 437/44 |

FOREIGN PATENT DOCUMENTS

| | | | |
|---|---|---|---|
| 0188924 | 7/1990 | Japan | 437/40 GS |

OTHER PUBLICATIONS

Codella, C. F. et al., "Submicron IGFET Device With Double Implanted Lightly Doped Drain/Source Structure", IBM Technical Disclosure Bulletin, vol. 26, No. 12, May 1984, pp. 6584–6586.

*Primary Examiner*—Trung Dang
*Attorney, Agent, or Firm*—Rennie William Dover

[57] ABSTRACT

Insulated gate semiconductor device (10) and a method of manufacturing the insulated gate semiconductor device (10). The insulated gate semiconductor device (10) includes an N-channel transistor (15) and a P-channel transistor (16). The N-channel transistor (15) has a gate electrode (35) that has a central portion (28) and two adjacent gate extensions (49, 52). Likewise the P-channel transistor (16) has a gate electrode (35') which has a central portion (29) and two adjacent gate extensions (53, 54). The gate extensions (49, 52, 53, 54) allow the formation of graded channel regions underneath the gate electrodes (35, 35') and adjacent to the source (57, 59) and drain (58, 62) regions by offsetting an LDD or a single heavily doped source/drain implant from channel regions which are covered by the gate extensions (49, 52 53, 54).

13 Claims, 15 Drawing Sheets

METHOD FOR MANUFACTURING AN INSULATED GATE SEMICONDUCTOR DEVICE

BACKGROUND OF THE INVENTION

The present invention relates, in general, to semiconductor devices, and more particularly, to insulated gate semiconductor devices.

Generally, portable communications equipment, as well as portable computers, use low voltage and low power electronic components to conserve power, weight, and size, thereby increasing their portability. In an effort to lower power consumption, the electronic components in these types of systems are designed to operate at supply voltages of less than 5 volts (V). Typically, device parameters such as drain current, threshold voltage, threshold voltage sensitivity, body effect, subthreshold leakage currents, parasitic source/drain capacitances, and source to drain punchthrough voltages limit the operation of insulated gate semiconductor devices at voltages less than 5 volts. Moreover, techniques that improve some device parameters tend to degrade other device parameters. For example, threshold voltage control and the source to drain punchthrough voltages are improved by increasing the dopant concentration between the source and drain regions of the insulated gate semiconductor devices; however, the increased dopant concentration adversely affects the drain current, the body effect, and parasitic source/drain capacitances.

One technique for providing punchthrough protection includes tailoring the dopant concentration profiles near the source and drain regions such that a lateral component of the dopant concentration profiles of these regions has a sufficient dopant concentration to prevent punchthrough while providing a low threshold voltage. Another technique is to increase the doping concentration of the substrate, i.e., the dopant well. However, these techniques typically reduce carrier mobility, thereby lowering the drain current.

Accordingly, it would be advantageous to have an insulated gate semiconductor device and a method for fabricating the insulated gate semiconductor device that improves control of the threshold voltage and increases source/drain to substrate breakdown voltages while providing higher drain current. It would be of further advantage for the method to reduce parasitic source/drain capacitances. Further, the method should be simple and capable of integration into insulated gate semiconductor device process flows.

DETAILED DESCRIPTION OF THE DRAWINGS

Generally, the present invention provides an insulated gate semiconductor device such as an insulated gate field effect transistor and a method of fabricating or forming the transistor. More particularly, the method allows fabrication of insulated gate field effect transistors using a single doping step to form the source and drain regions as well as a lightly doped drain (LDD). Moreover, the active sources of the insulated gate field effect transistors are shallow, whereas the extrinsic sources are sufficiently deep to permit formation of source and drain electrodes without consuming the source and drain regions during silicide formation. Further, insulated gate semiconductor devices manufactured in accordance with the present invention may be fabricated as symmetric devices (bilateral embodiment) or as asymmetric devices (unilateral embodiment). In the bilateral embodiment, halo regions surround both the source and drain regions of the insulated gate semiconductor device, whereas in the unilateral embodiment a halo region surrounds the source region of the insulated gate semiconductor device.

Moreover, in accordance with a multi-step gate extension embodiment of the present invention, formation of a gate electrode having gate extensions is performed using a plurality of gate material deposition steps, whereas in a single-step gate extension embodiment of the present invention, formation of the gate electrode having gate extensions is performed using a single gate material deposition step. It should be noted that unilateral and bilateral insulated gate semiconductor devices may be fabricated in accordance with either the multi-step gate extension embodiment or the single-step gate extension embodiment.

Figure 1:
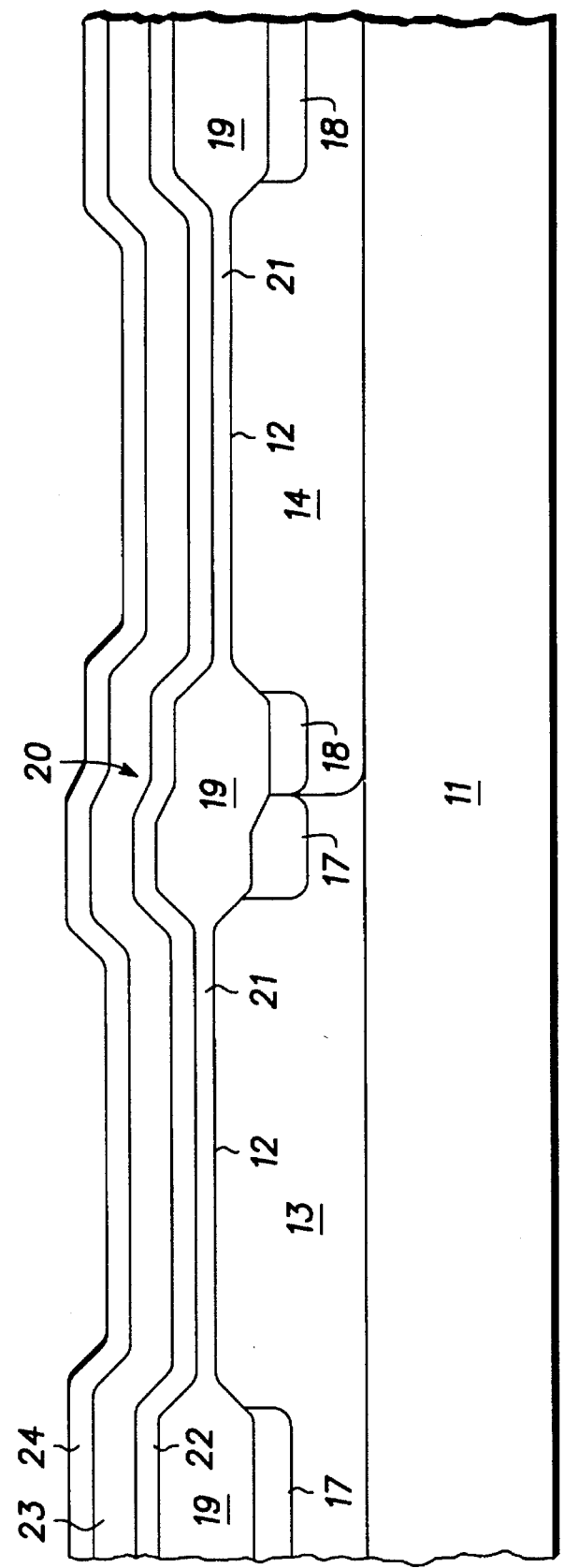
FIGS. 1–2 illustrate enlarged cross-sectional views of a portion of an insulated gate semiconductor device during processing in accordance with the present invention.

FIG. 1 illustrates an enlarged cross-sectional view of a portion of a partially completed low power insulated gate field effect transistor during processing in accordance with the present invention. What is shown in FIG. 1 is a semiconductor substrate 11 of P conductivity type having a major surface 12. Substrate 11 has, for example, a resistivity ranging between approximately 8 ohm-centimeter ($\Omega$-cm) and approximately 25 $\Omega$-cm. An impurity well 13 of P conductivity type, commonly referred to as a P-well, extends into semiconductor substrate 11 from a first portion of major surface 12 and an impurity well 14 of N conductivity type extends into substrate 11 from a second portion of major surface 12. P-well 13 laterally abuts N-well 14. By way of example, impurity wells 13 and 14 have a surface concentration ranging from approximately $1\times10^{16}$ atoms per cubic centimeter (atoms/cm$^3$) to approximately $1\times10^{18}$ atoms/cm$^3$. Methods for forming impurity wells 13 and 14 are commonly referred to as self-aligned twin well processes and typically result in the formation of bird's beaks 20. Twin well processes and bird's beak formation are well known to those skilled in the art. Dopant regions 17 are formed in P-well 13, dopant regions 18 are formed in N-well 14, and field oxide regions 19 are formed on wells 13 and 14. Dopant regions 17 and 18 prevent inversion under field oxide regions 19 and provide isolation punchthrough protection.

Still referring to FIG. 1 and using techniques well known to those skilled in the art, a layer of dielectric material 21 is formed on major surface 12 and a layer of material 22 for extending a gate electrode, i.e., a gate electrode extension material, is formed on layer of dielectric material 21. By way of example, layer of dielectric material 21 is oxide having a thickness ranging between approximately 50 angstroms and approximately 150 angstroms. Preferably, layer of oxide 21 has a thickness of approximately 100 angstroms. Suitable materials for layer of gate electrode extension material 22 include polysilicon, polycide, and the like, having a thickness ranging between approximately 500 angstroms and approximately 1,500 angstroms. Preferably, layer of gate electrode extension material 22 has a thickness of approximately 1,000 angstroms.

A layer of dielectric material 23 is formed on layer of gate electrode extension material 22. Layer of dielectric material 23 may be, for example, oxide formed using well known processes such as a tetraethylorthosilicate (TEOS) deposition process. By way of example, oxide layer 23 has a thickness ranging between approximately 1,500 angstroms and approximately 3,000 angstroms. Preferably, oxide layer 23 has a thickness of approximately 2,000 angstroms. It should be understood that the thickness of oxide layer 23 sets the height or thickness of portions of a gate electrode (reference numerals 28 and 29 of FIG. 4). Using techniques well known to those skilled in the art, oxide layer 23 is coated or covered with a layer of photoresist 24.

Figure 2:
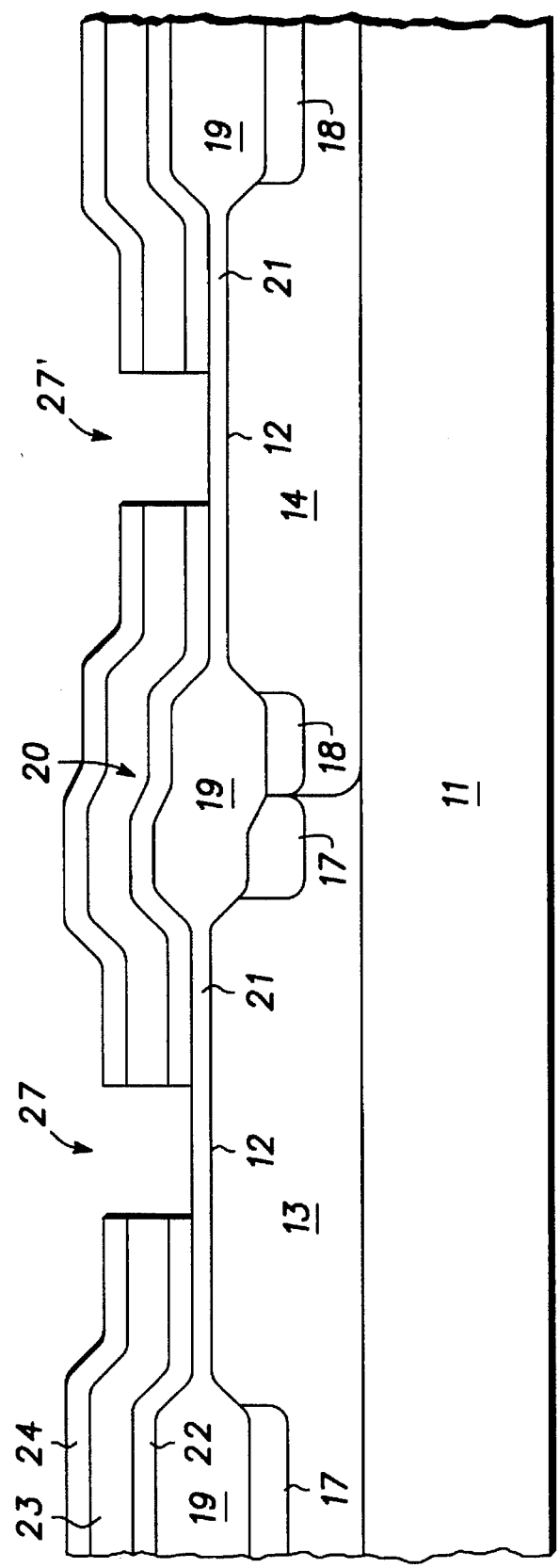

FIG. 2 illustrates an enlarged cross-sectional view of the portion of the partially completed low power insulated gate semiconductor device of FIG. 1 further along in processing. It shall be understood that the same reference numerals are used in the figures to denote the same elements. It shall be further understood that the concentrations and thicknesses provided in the description of the present invention merely serve as exemplary values and are not limitations of the present invention. Using photolithographic techniques well known in the art, layer of photoresist 24 is patterned to form openings 27 and 27' which expose portions of oxide layer 23. The exposed portions of oxide layer 23 are anisotropically etched to expose portions of gate electrode extension layer 22, which in turn are anisotropically etched to expose portions of oxide layer 21. Typically, anisotropic etching is performed using a reactive ion etch (RIE). In a first step, the RIE etch is performed using $CF_6$ which is selective for oxide. In a second step the RIE etch is accomplished using an etching species that is selective for the particular material of layer 22. For example, when layer 22 is nitride, $CF_4$ is used as an etching species, whereas $Cl_2$ is used as the etching species when layer 22 is polysilicon. Layer of oxide 21 serves as an etchstop for the etching species that etches layer 22. Layer of photoresist 24 is removed.

Figure 3:
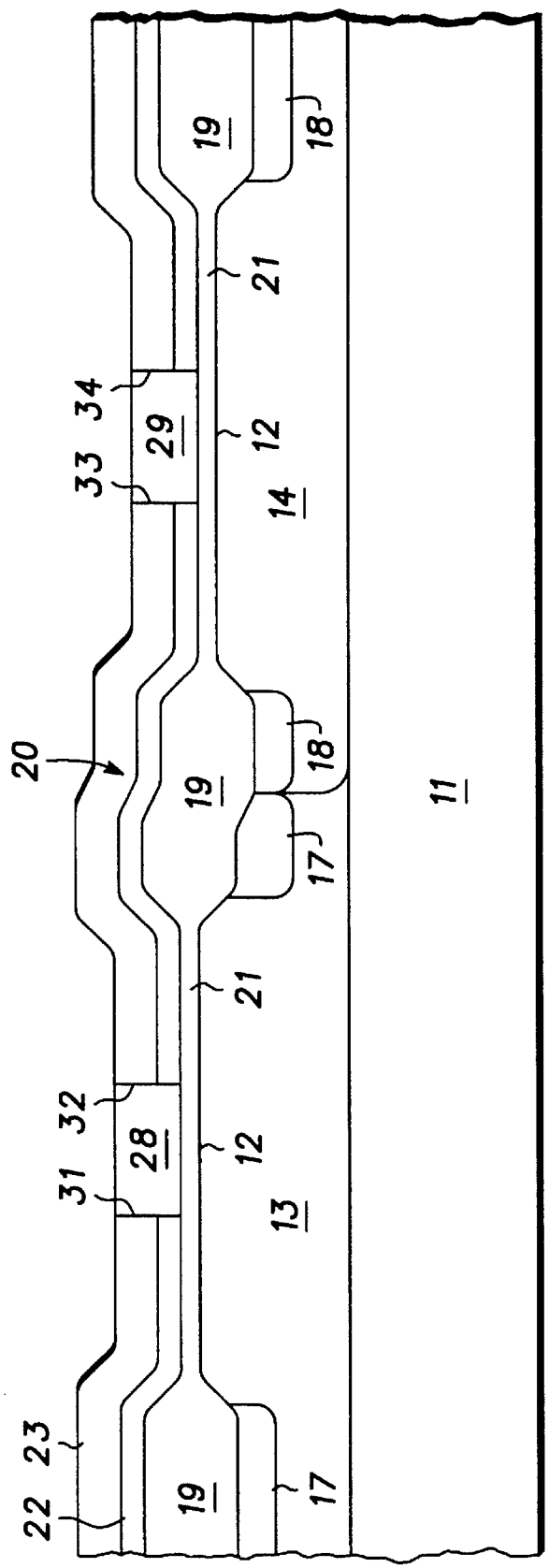
FIGS. 3–7 illustrate enlarged cross-sectional views of a portion of a bilateral insulated gate semiconductor device during processing in accordance with a multi-step gate extension embodiment of the present invention.

Referring now to FIG. 3, dielectric layer 23 is conformally coated with a layer of polysilicon (not shown) which fills openings 27 (shown in FIG. 2). The layer of polysilicon is removed from dielectric layer 23 leaving polysilicon plugs 28 and 29 in openings 27 and 27', respectively. Preferably, the step of removing the layer of polysilicon serves as a planarization step. Thus, polysilicon plugs 28 and 29 are coplanar with dielectric layer 23. It should be noted that polysilicon plug 28 has edges or sides 31 and 32 and serves as a first portion of a gate electrode for an N-channel field effect transistor 15 (shown in FIG. 7), whereas polysilicon plug 29 has edges 33 and 34 and serves as a first portion of a gate electrode for a P-channel field effect transistor 16 (shown in FIG. 7). Using techniques well known to those skilled in the art, polysilicon plug 28 is doped to be of N conductivity type and polysilicon plug 29 is doped to be of P conductivity type.

It should be noted that the insulated gate semiconductor device of FIGS. 1–7 is a complementary field effect transistor. In other words, an N-channel transistor 15 is formed in P-well 13 and a P-channel transistor 16 is formed in N-well 14. However, the present invention is not limited to complementary devices; for example, an N-channel field effect transistor may be fabricated in a substrate of P conductivity type or a P-channel field effect transistor may be fabricated in a substrate of N conductivity type.

Figure 4:
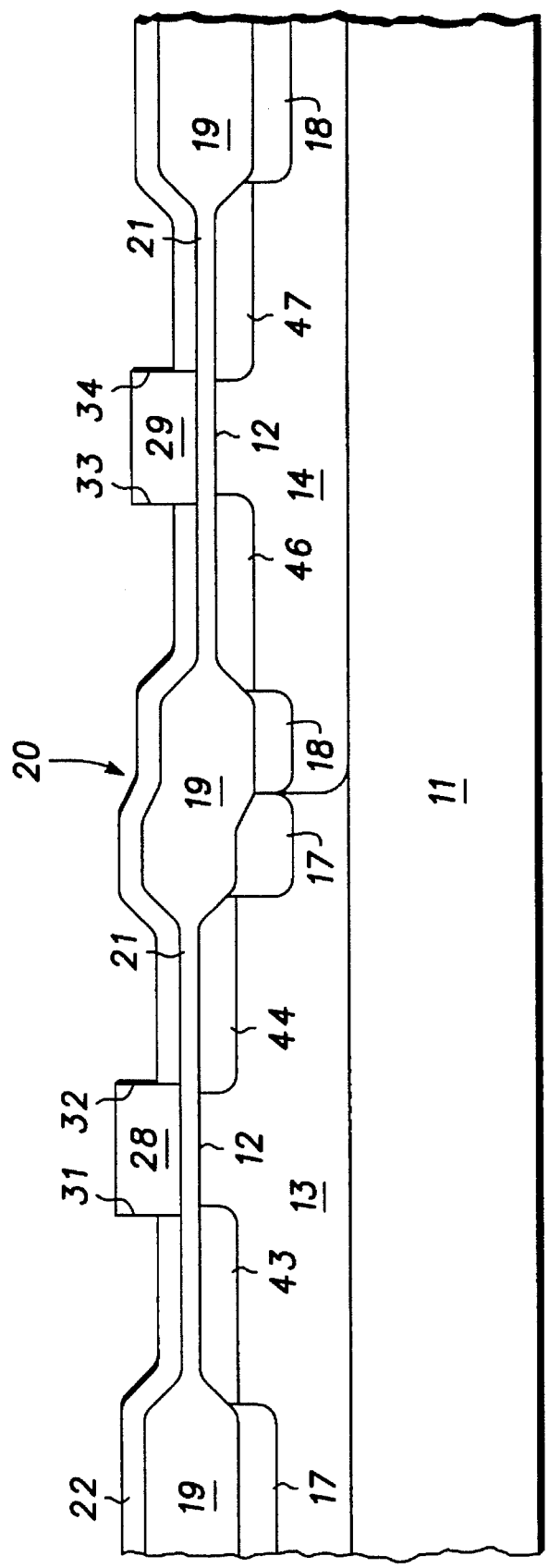

Now referring to FIG. 4, oxide layer 23 is removed from gate electrode extension layer 22 using an isotropic etch. A layer of photoresist (not shown) is formed on gate electrode extension 22 and polysilicon plugs 28 and 29. The layer of photoresist is patterned to expose portions of gate electrode extension 22 above P-well 13 and adjacent to polysilicon plug 28. The portions of the layer of photoresist that remain after patterning serve as an implant block mask. An impurity material of P conductivity type such as, for example, boron is implanted through the exposed portions of gate electrode extension layer 22 and into P-well 13, thereby forming dopant regions 43 and 44. By way of example, dopant regions 43 and 44 have a concentration ranging between approximately $1 \times 10^{16}$ atoms/cm$^3$ and approximately $5 \times 10^{17}$ atoms/cm$^3$, and vertically extend approximately 0.3 µm into P-well 13 from major surface 12. It should be noted the depth of the dopant regions 43 and 44 is not a limitation of the present invention and that the depth of dopant regions 43 and 44 may be less than 0.1 µm. Suitable implant parameters for forming dopant regions 43 and 44 include an implant dose ranging between approximately $1 \times 10^{12}$ atoms/cm$^2$ and approximately $1 \times 10^{14}$ atoms/cm$^2$ and an implant energy ranging from approximately 40 kilo electron volts (KeV) to approximately 80 KeV. It should be noted that these dopant regions are part of the channel region for N-channel field effect transistor 15. The layer of photoresist is removed. Methods for forming, patterning, and removing portions of a layer of photoresist are well known to those skilled in the art.

Another layer of photoresist (not shown) is formed on gate electrode extension layer 22, polysilicon plugs 28 and 29 and is patterned to expose portions of gate electrode extension 22 above N-well 14 and adjacent to polysilicon plug 29. Portions of the layer of photoresist that remain after patterning serve as an implant block mask. An impurity material of N conductivity type such as, for example, phosphorus, is implanted through the exposed portions of gate electrode extension layer 22 and into N-well 14, thereby forming dopant regions 46 and 47. By way of example, dopant regions 46 and 47 have a concentration ranging between approximately $1 \times 10^{16}$ atoms/cm$^3$ and approximately $5 \times 10^{17}$ atoms/cm$^3$, and vertically extend approximately 0.3 µm into N-well 14 from major surface 12. It should be noted the depth of the dopant regions 46 and 47 is not a limitation of the present invention. Suitable implant parameters for forming dopant regions 46 and 47 include an implant dose ranging between approximately $1 \times 10^{12}$ atoms/cm$^2$ and approximately $1 \times 10^{14}$ atoms/cm$^2$ and an implant energy ranging from approximately 40 KeV to approximately 100 KeV. These dopant regions serve as a portion of the channel region for P-channel field effect transistor 16. The layer of photoresist is removed. Dopant regions 43, 44, 46, and 47 are also referred to as halo or pocket regions.

The dopant concentrations of dopant regions 43 and 44 are selected to set the $V_T$ of N-channel field effect transistor 15, whereas the dopant concentrations of dopant regions 46 and 47 are selected to set the $V_T$ of P-channel field effect transistor 16. Further, the depths of the dopant regions 43, 44, 46, and 47 are selected to optimize the punchthrough properties and to set the source/drain to bulk capacitances of transistors 15 and 16, respectively. For example, a $V_T$ for N-channel field effect transistor 15 ranging from approximately 300 millivolts (mV) to 600 mV may be achieved by forming dopant regions 43 and 44 to have a surface concentration ranging from approximately $1 \times 10^{16}$ atoms/cm$^3$ to approximately $5 \times 10^{17}$ atoms/cm$^3$. Likewise, a $V_T$ for P-channel field effect transistor 16 ranging from approximately −300 mV to approximately −600 mV may be achieved by forming dopant regions 46 and 47 to have a surface concentration ranging from approximately $1 \times 10^{16}$ atoms/cm$^3$ to approximately $5 \times 10^{17}$ atoms/cm$^3$. As those skilled in the art will understand, a specific value for $V_T$ is a design choice and is obtained in accordance with dose and implant energies used in the formation of dopant regions 43, 44, 46, and 47.

Figure 5:
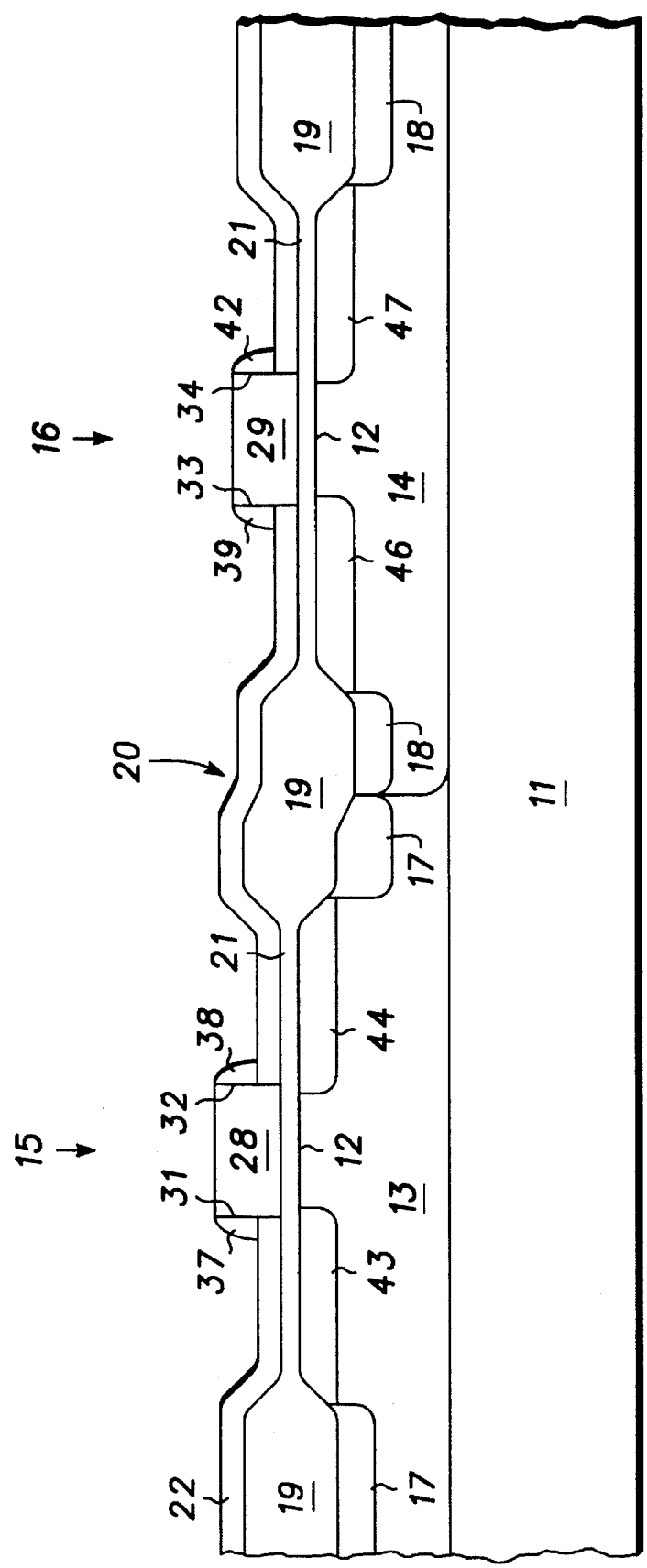

FIG. 5 illustrates an enlarged cross-sectional view of a portion of a partially completed low power insulated gate semiconductor device 10 during processing. The portion of partially completed low power insulated gate semiconductor device 10 is shown at a processing step subsequent to the processing step shown in FIG. 4. A conformal layer of dielectric material (not shown) is formed on gate electrode extension layer 22 and polysilicon plugs 28 and 29. Suitable materials for the conformal layer of dielectric material include oxide, nitride, or the like. The conformal layer of dielectric material is removed from gate electrode extension layer 22 using an anisotropic etch. Portions of the conformal layer of dielectric material adjacent edges 31, 32, and 34 remain after the anisotropic etch, thereby forming spacers 37, 38, 39, and 42, respectively.

Figure 6:
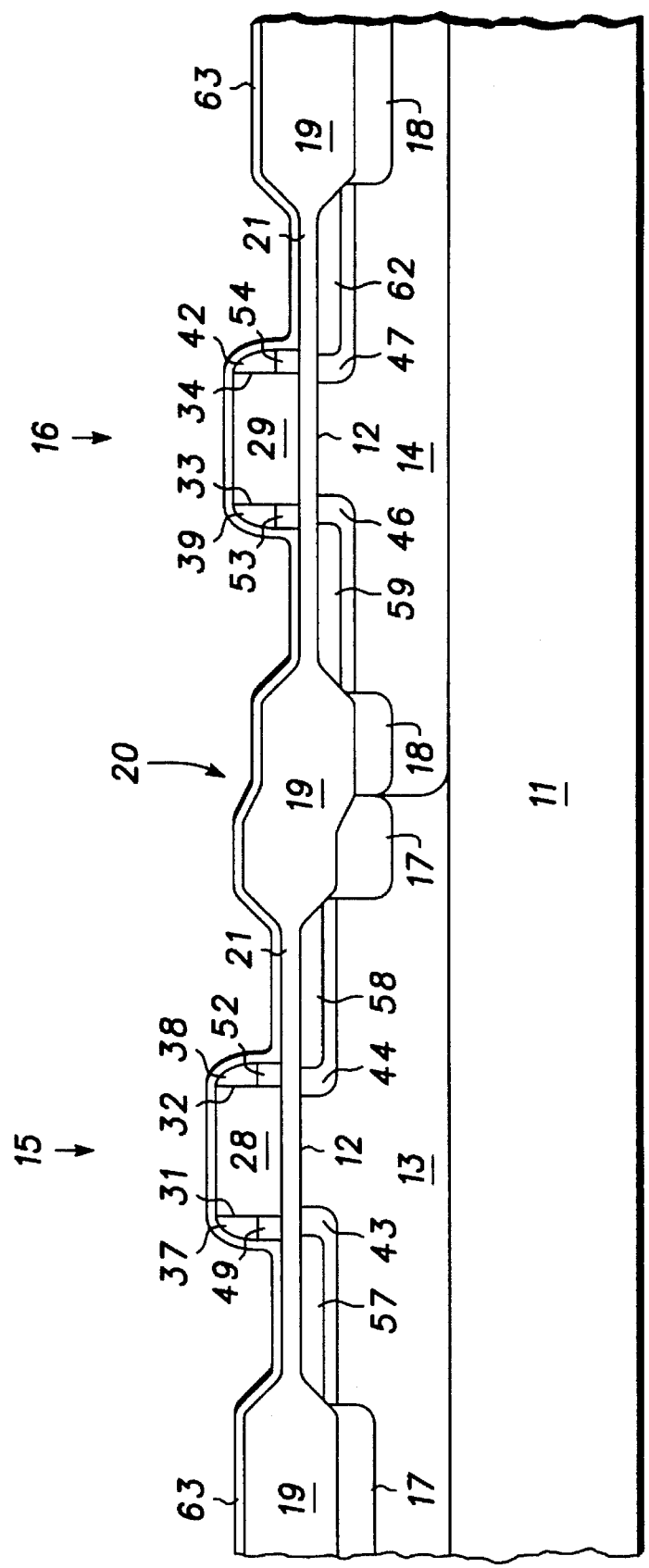

FIG. 6 illustrates an enlarged cross-sectional view of the portion of the partially completed low power insulated gate semiconductor device 10 of FIG. 5 further along in processing. A timed anisotropic etch is performed to remove the portions of gate electrode extension layer 22 not covered by spacers 37, 38, 39, and 42. Portions 49 and 52 of gate electrode extension material 22 adjacent edges 31 and 32 and below spacers 37 and 38, respectively, remain after the anisotropic RIE etch step and serve as gate electrode extensions of gate electrode 35 (shown in FIG. 7). In other words, portion 49 serves as a second portion of gate electrode 35 and portion 52 serves as a third portion of gate electrode 35. In addition, portions 53 and 54 of gate electrode extension material 22 adjacent edges 33 and 34 and below spacers 39 and 42, respectively, remain after the anisotropic RIE etch step and serve as gate electrode extensions of gate electrode 35' (shown in FIG. 7). Portion 53 serves as a second portion of gate electrode 35' and portion 54 serves as a third portion of the gate electrode 35'. Although not shown, it should be noted that during the etch of the uncovered portions of gate electrode extension layer 22, polysilicon gate plugs 28 and 29 become recessed. Thus, it is preferable that the thickness of oxide layer 23 be selected to accommodate this recess.

A layer of photoresist (not shown) is formed on field oxide regions 19, the exposed portions of layer of dielectric material 21, polysilicon plugs 28 and 29, and spacers 37, 38, 39, and 42. The layer of photoresist is patterned to expose portions of layer of dielectric material 19 above P-well 13 and adjacent to polysilicon plug 28. An impurity material of N conductivity type such as, for example, arsenic, is implanted into subportions of regions 43 and 44 to form dopant regions 57 and 58, respectively. Dopant regions 57 and 58 serve as source and drain regions, respectively, of the N-channel field effect transistor 15. By way of example, dopant regions 57 and 58 have a concentration ranging from approximately $1 \times 10^{19}$ atoms/cm$^3$ to approximately $5 \times 10^{20}$ atoms/cm$^3$ and vertically extend approximately 0.15 µm into dopant regions 43 and 44, respectively, from major surface 12. The layer of photoresist is removed.

Another layer of photoresist (not shown) is formed on field oxide regions 19, the exposed portions of layer of dielectric material 21, polysilicon plugs 28 and 29, and spacers 37, 38, 39, and 42. The layer of photoresist is patterned to expose portions of layer of dielectric material 19 above N-well 14 and adjacent to polysilicon plug 29. An impurity material of P conductivity type such as, for example, BF$_2$ is implanted into sub-portions of regions 46 and 47 to form dopant regions 59 and 62, respectively. Dopant regions 59 and 62 serve as source and drain regions, respectively, of p-channel field effect transistor 16. By way of example, dopant regions 59 and 62 have a concentration ranging from approximately $1 \times 10^{19}$ atoms/cm$^3$ to approximately $5 \times 10^{20}$ atoms/cm$^3$ and vertically extend approximately 0.15 µm into dopant regions 59 and 62, respectively, from major surface 12. A layer of dielectric material 63 is formed on field oxide regions 19, the exposed portions of layer of dielectric material 21, portions 28 and 29 of the respective gage electrodes 35 and 35', and spacers 37, 38, 39, and 42. The layer of photoresist is removed.

Figure 7:
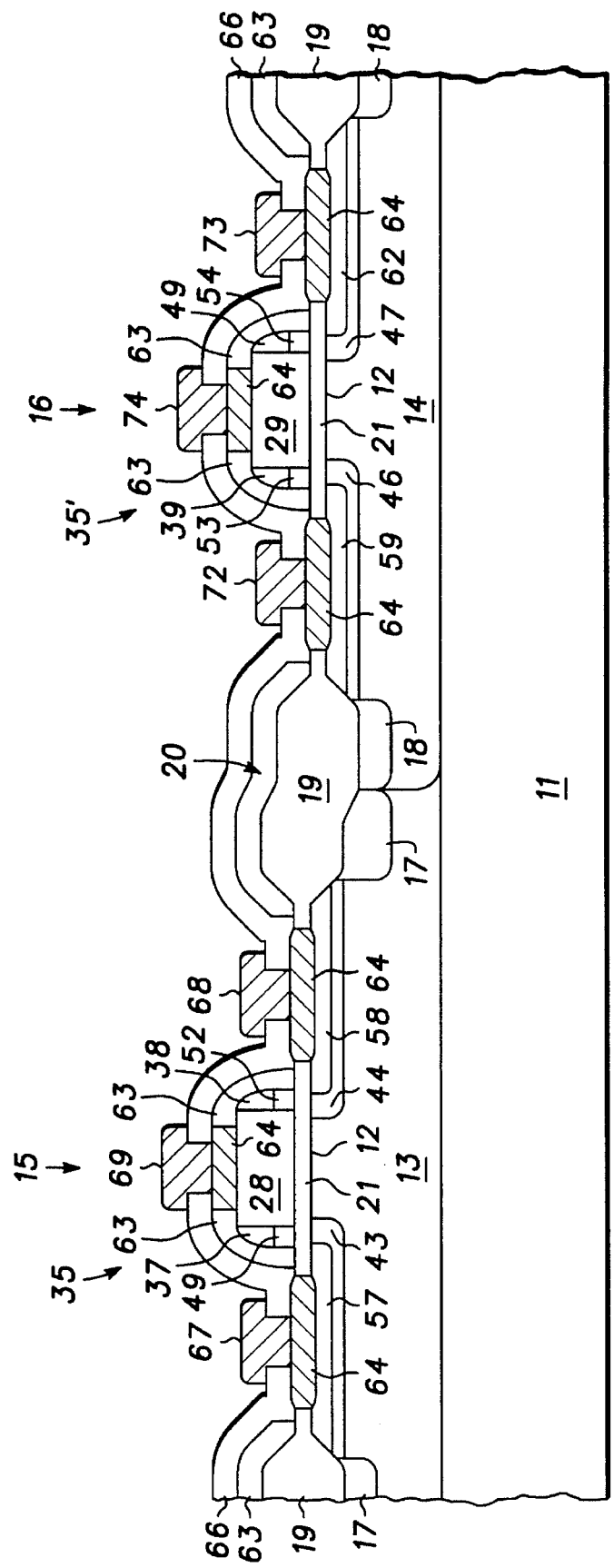

Now referring to FIG. 7 electrodes are formed which contact first portion 28, source region 57, and drain region 58 of N-channel field effect transistor 15 and first portion 29, source region 59, and drain region 62 of P-channel field effect transistor 16. More particularly, openings (not shown) are formed in layer of dielectric material 63 to expose portions of source regions 57 and 59, portions of drain regions 58 and 62, and portions 28 and 29 of gate electrodes 35 and 35', respectively. Silicide 64 is formed on the exposed portions of regions 57, 58, 59, and 62 and on the exposed portions gate electrodes 35 and 35'. An insulating layer 66 is formed on layer of dielectric material 63 and silicide 64. A plurality of openings (not shown) are formed in insulating layer 66 to expose portions of silicide 64 on source regions 57 and 59, drain regions 58 and 62, and gate electrodes 35 and 35'. A source electrode 67 is formed to contact silicide 64 on source region 57, a drain electrode 68 is formed to contact silicide 64 on drain region 58, and a gate contact 69 is formed to contact silicide 64 on gate electrode 35 of N-channel insulated gate field effect transistor 15. Likewise, a source electrode 72 is formed to contact silicide 64 on source region 59, a drain electrode 73 is formed to contact silicide 64 on drain region 62, and a gate contact 74 is formed to contact silicide 64 on gate electrode 35' of P-channel insulated gate field effect transistor 16. Methods for forming silicides and electrodes to silicided regions are well known to those skilled in the art. It should be understood that in the bilateral embodiment, the position of the source and drain regions is not a limitation of the present invention. In other words, in a symmetric semiconductor device having source and drain regions, these regions are interchangeable.

Figure 8:
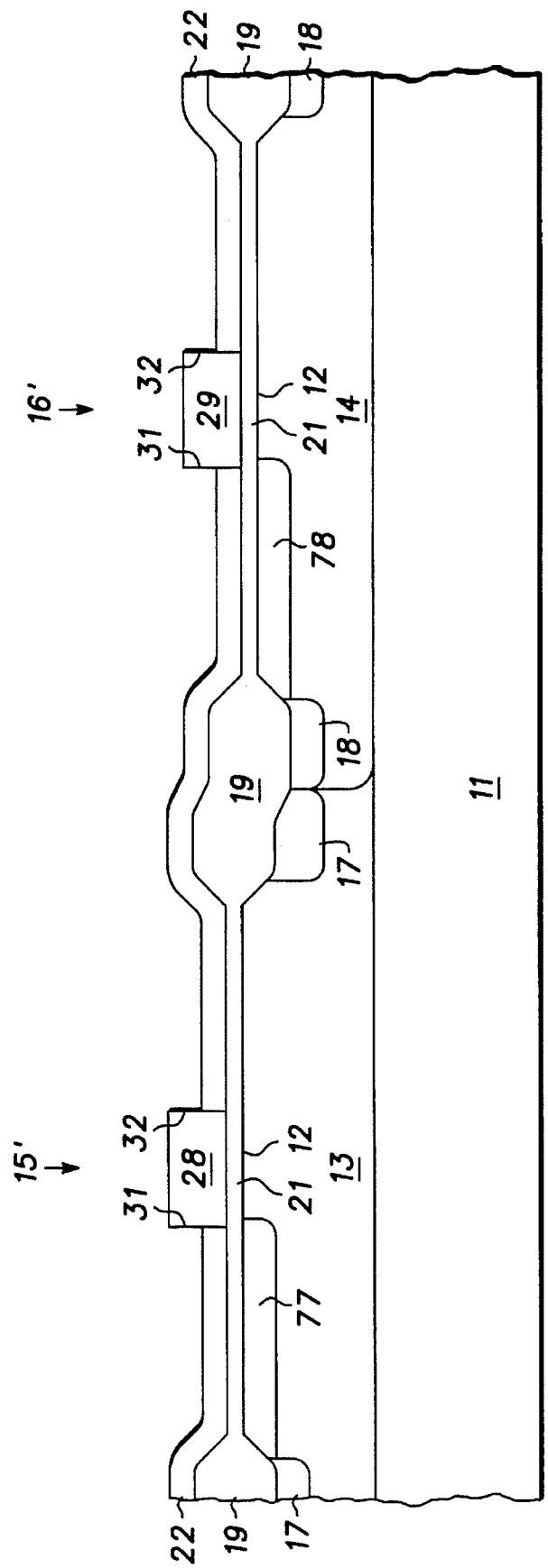
FIGS. 8–10 illustrate enlarged cross-sectional views of a portion of a unilateral insulated gate semiconductor device during processing in accordance with the multi-step gate extension embodiment of the present invention.

FIG. 8 illustrates an enlarged cross-sectional view of a portion of a partially completed low power insulated semiconductor device 76 in accordance with a unilateral multi-step gate extension embodiment of the present invention. It should be noted that the structure shown in FIG. 8 follows from the structure shown in FIG. 3 at a subsequent processing step. A layer of photoresist (not shown) is formed on gate electrode extension layer 22, and polysilicon plugs 28 and 29. An opening is formed in the layer of photoresist to expose the portion of gate electrode extension layer 22 adjacent side 31 of polysilicon plug 28. The remaining portions of the layer of photoresist serve as an implant protection mask.

An impurity material of P conductivity type such as, for example, boron is implanted through the exposed portion of gate electrode extension layer 22 and into P-well 13, thereby forming dopant region 77. The remaining portions of the layer of photoresist are removed and another layer of photoresist (not shown) is formed on gate electrode extension layer 22, and polysilicon plugs 28 and 29. An opening is formed in this layer of photoresist to expose the portion of gate electrode extension layer 22 adjacent side 33 of polysilicon plug 29. An impurity material of N conductivity type such as, for example, phosphorus is implanted through the exposed portion of gate electrode extension layer 22 and into N-well 14, thereby forming dopant region 78. By way of example, dopant regions 77 and 78 have dopant concentrations ranging from approximately $1 \times 10^{16}$ atoms/cm$^3$ to $5 \times 10^{17}$ atoms/cm$^3$, wherein dopant region 77 extends vertically approximately 0.3 µm into P-well 13 and dopant region 78 extends vertically approximately 0.30 µm into N-well 14.

Figure 9:
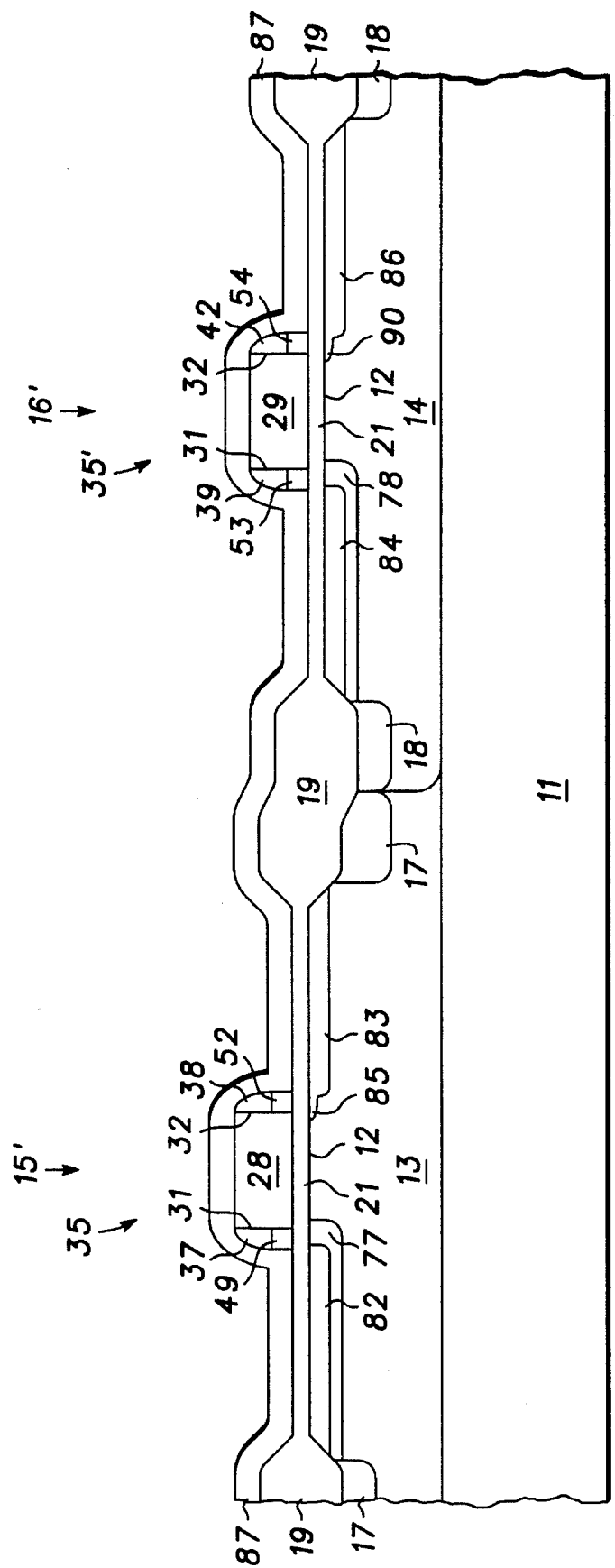

FIG. 9 illustrates an enlarged cross-sectional view of the portion of the partially completed insulated gate field effect transistor 76 of FIG. 8 further along in processing. Spacers 37, 38, 39, and 42 as well as portions 49, 52, 53, and 54 of gate electrode extension material 22 are formed as described with reference to FIGS. 5 and 6. It should be understood that portions 49 and 52 serve as second and third portions, respectively, of gate 35, i.e., gate electrode extensions for gate electrode 35, and portions 53 and 54 serve as second and third portions, respectively, of gate 35', i.e., gate electrode extensions for gate 35'. A layer of photoresist is formed on insulated gate field effect transistor 16'. An impurity material of N conductivity type such as, for example, arsenic, is implanted into portions of P-well 13 to form dopant regions 82 and 83, respectively. Dopant regions 82 and 83 serve as source and drain regions, respectively, of N-channel field effect transistor 15'. Gate extension portion 52 serves to partially block the implant, thereby forming a lightly doped drain region 85 adjacent to and in contact with drain region 83. By way of example, dopant regions 82 and 83 have a concentration ranging from approximately $5 \times 10^{19}$ atoms/cm$^3$ to approximately $5 \times 10^{20}$ atoms/cm$^3$ and vertically extend approximately 0.15 µm into dopant regions 77 and P-well 13, respectively, from major surface 12. The layer of photoresist is removed.

A layer of photoresist is formed on N-channel field effect transistor 15' and an impurity material of P conductivity type such as, for example, BF$_2$, is implanted into portions of N-well 14 to form dopant regions 84 and 86, respectively. Dopant regions 84 and 86 serve as source and drain regions, respectively, of the P-channel field effect transistor 16'. Gate extension portion 54 serves to partially block the implant, thereby forming a lightly doped drain region 90 adjacent to and in contact with drain region 86. By way of example, dopant regions 84 and 86 have a concentration ranging from approximately $5 \times 10^{19}$ atoms/cm$^3$ to approximately $5 \times 10^{20}$ atoms/cm$^3$ and vertically extend approximately 0.15 µm into dopant region 78 and N-well 14, respectively, from major surface 12. The layer of photoresist is removed. A layer of dielectric material 87 is formed on field oxide regions 19, the exposed portions of layer of dielectric material 21, portions 28 and 29 of the respective gate electrodes 35 and 35', and spacers 37 and 39, and gate electrode extensions 52 and 54.

Figure 10:
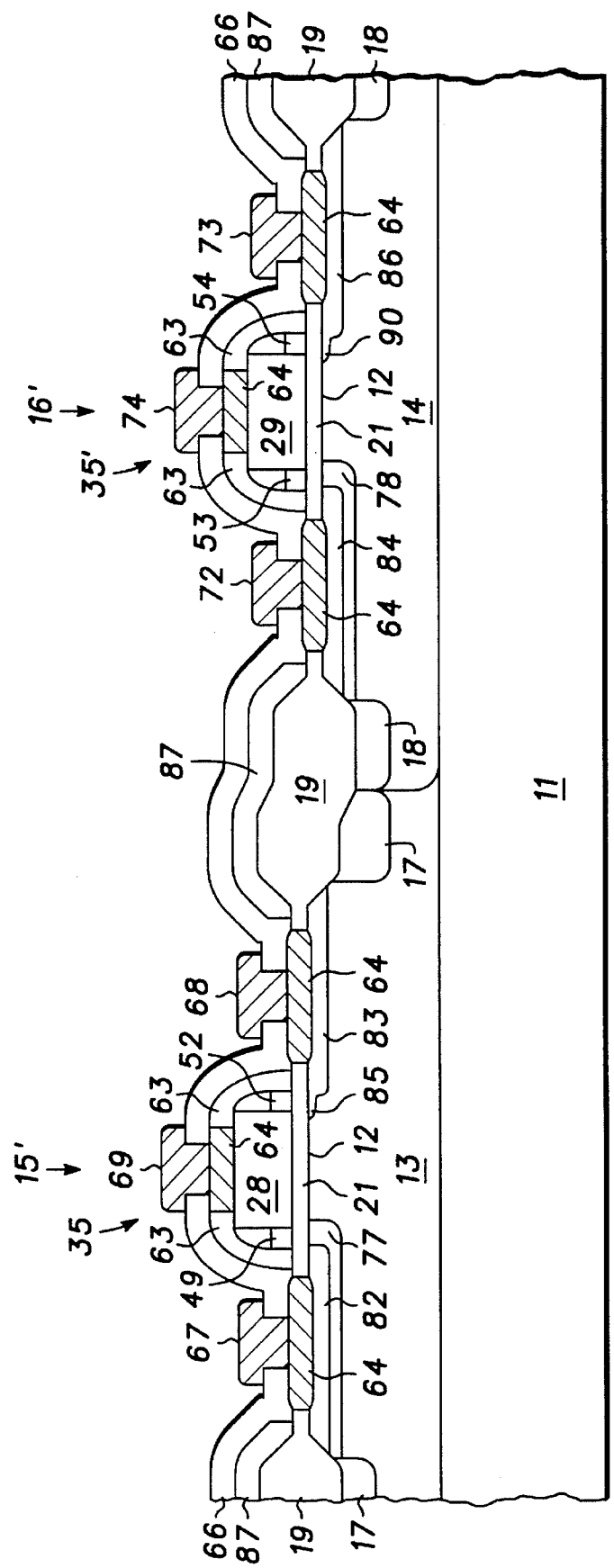

Now referring to FIG. 10 electrodes are formed which contact first portion 28, source region 82, and drain region 83 of N-channel field effect transistor 15' and first portion 29, source region 84, and drain region 86 of P-channel field effect transistor 16'. More particularly, openings (not shown) are formed in layer of dielectric material 87 to expose portions of source regions 82 and 84, portions of drain regions 83 and 86, and portions 28 and 29 of gate electrodes 35 and 35', respectively. Silicide 64 is formed on the exposed portions of regions 77, 83, 84, and 86 and on the exposed portions of gate electrodes 35 and 35'. An insulating layer 66 is formed on layer of dielectric material 87 and silicide 64. A plurality of openings (not shown) are formed in insulating layer 66 to expose portions of silicide 64 on source regions 82 and 84, drain regions 83 and 86, and gate electrodes 35 and 35'. A source electrode 67 is formed to contact silicide 64 on source region 82, a drain electrode 68 is formed to contact silicide 64 on drain region 83, and a gate contact 69 is formed to contact silicide 64 on gate electrode 35 of N-channel insulated gate field effect transistor 15'. Likewise, a source electrode 72 is formed to contact silicide 64 on source region 84, a drain electrode 73 is formed to contact silicide 64 on drain region 86, and a gate contact 74 is formed to contact silicide 64 on gate electrode 35' of P-channel insulated gate field effect transistor 16'.

Figure 11:
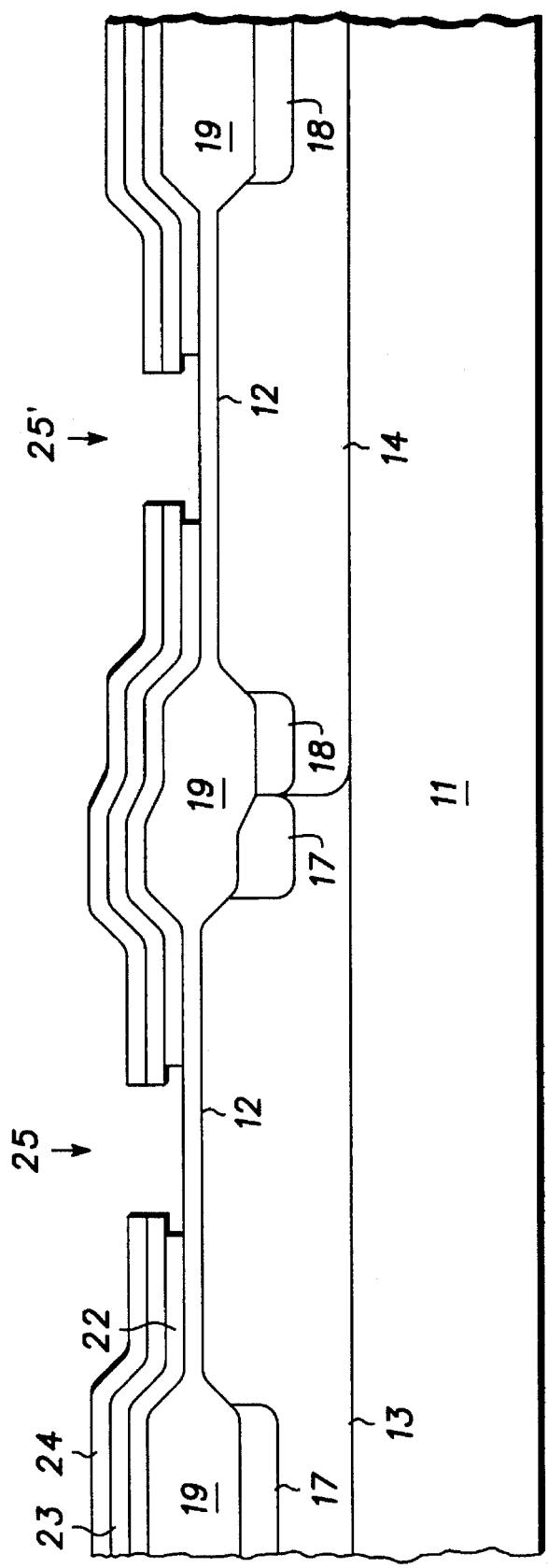
FIGS. 11–13 illustrate enlarged cross-sectional views of a portion of an insulated gate semiconductor device formed in accordance with a single-step gate extension embodiment of the present invention.

FIG. 11 illustrates an enlarged cross-sectional view of a portion of a partially completed low power insulated gate field effect transistor in accordance with a single-step gate extension embodiment during processing. It should be noted that the processing steps described in FIG. 1 apply to bilateral and unilateral insulated gate semiconductor devices fabricated in accordance with multi-step and single-step gate extension embodiments of the present invention. Using photolithographic techniques well known in the art, layer of photoresist 24 is patterned to form cavities or openings 25 and 25' which expose a portion of oxide layer 23. The depths of cavities 25 and 25' are increased by anisotropically etching the exposed portions of oxide layer 23, thereby exposing portions of gate electrode extension material 22. The widths of the portions of cavities 25 and 25' adjacent oxide layer 21, i.e., the bottom portions of cavities 25 and 25', are further increased by isotropically etching the exposed portions of gate electrode extension material 22, thereby exposing portions of layer of dielectric-material 21. The use of an anisotropic etch followed by an isotropic etch to form cavities 25 and 25' provides cavities 25 and 25' with an inverted "T-shape." Thus, cavities 25 and 25' are formed by laterally removing a portion of gate electrode extension layer 22. Typically, anisotropic etching is performed using a timed reactive ion etch (RIE), whereas isotropic etching may be performed using a wet etch or isotropic plasma etching. Techniques for performing anisotropic and isotropic etching are well known to those skilled in the art. Layer of photoresist 24 is removed.

Figure 12:
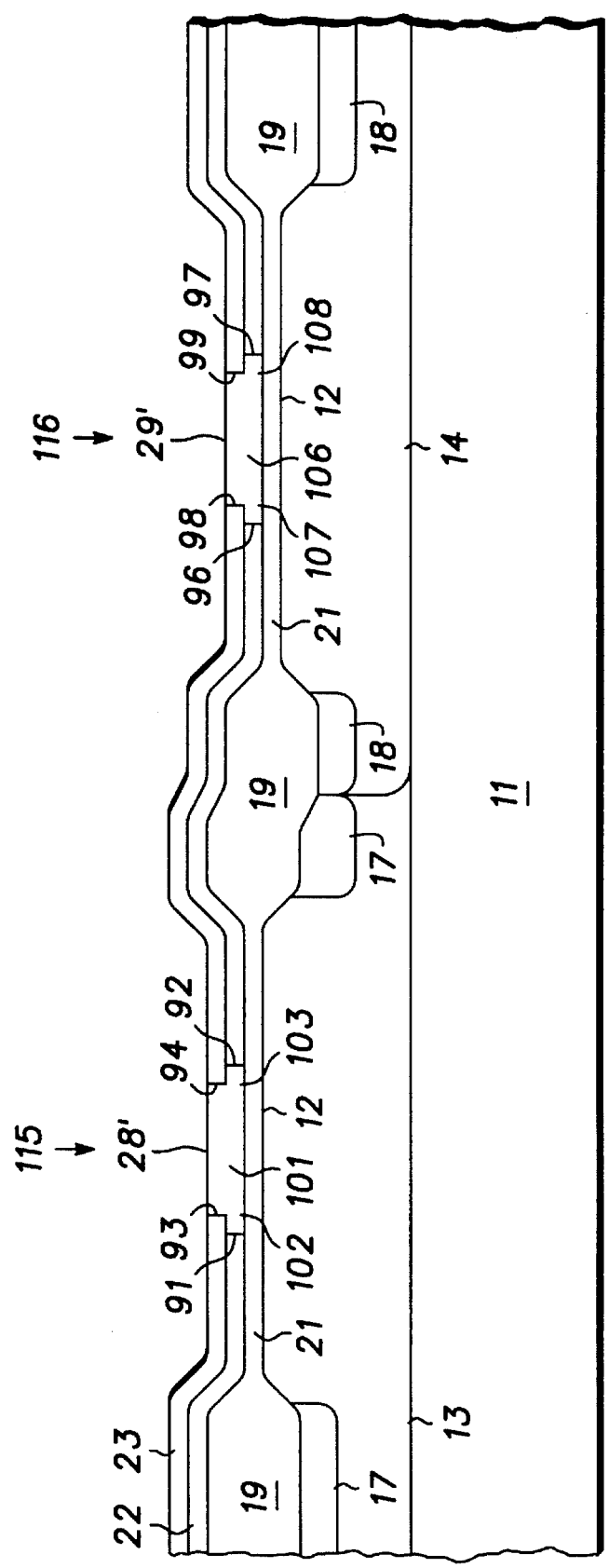

Referring now to FIG. 12, layer of dielectric material 23 is conformally coated with a layer of polysilicon (not shown) which fills cavities 25 and 25' (shown in FIG. 11). The layer of polysilicon is removed from layer of dielectric material 23 leaving a polysilicon plug 28' in cavity 25 and a polysilicon plug 29' in cavity 25'. Preferably, the step of removing the layer of polysilicon serves as a-planarization step. The shapes of polysilicon plugs 28' and 29' conform to the shapes of cavities 25 and 25'. Thus, polysilicon plugs 28' and 29' have "inverted-T" shapes having a base and a shaft, wherein the shaft is substantially perpendicular to the base. It should be noted that polysilicon plugs 28' and 29' serve as gate electrodes for N-channel and P-channel insulated gate field effect transistors 115 and 116, respectively. The base of polysilicon plug 28' is laterally bounded by sidewalls 91 and 92 and the shaft of polysilicon plug 28' is laterally bounded by sidewalls 93 and 94. Similarly, the base of polysilicon plug 29' is laterally bounded by sidewalls 96 and 97 and the shaft of polysilicon plug 29' is laterally bounded by sidewalls 98 and 99. The shaft serves as a first portion 101 of gate electrode 28', the portion of the base adjacent sidewall 91 serves as a second portion 102 of the gate electrode 28', and the portion of the base adjacent sidewall 92 serves as a third portion 103 of gate electrode 28'. Likewise, for gate electrode 29', the shaft serves as a first portion 106, the portion of the base adjacent sidewall 96 serves as a second portion 107, and the portion of the base adjacent sidewall 97 serves as a third portion 108 of gate electrode 29'.

Figure 13:
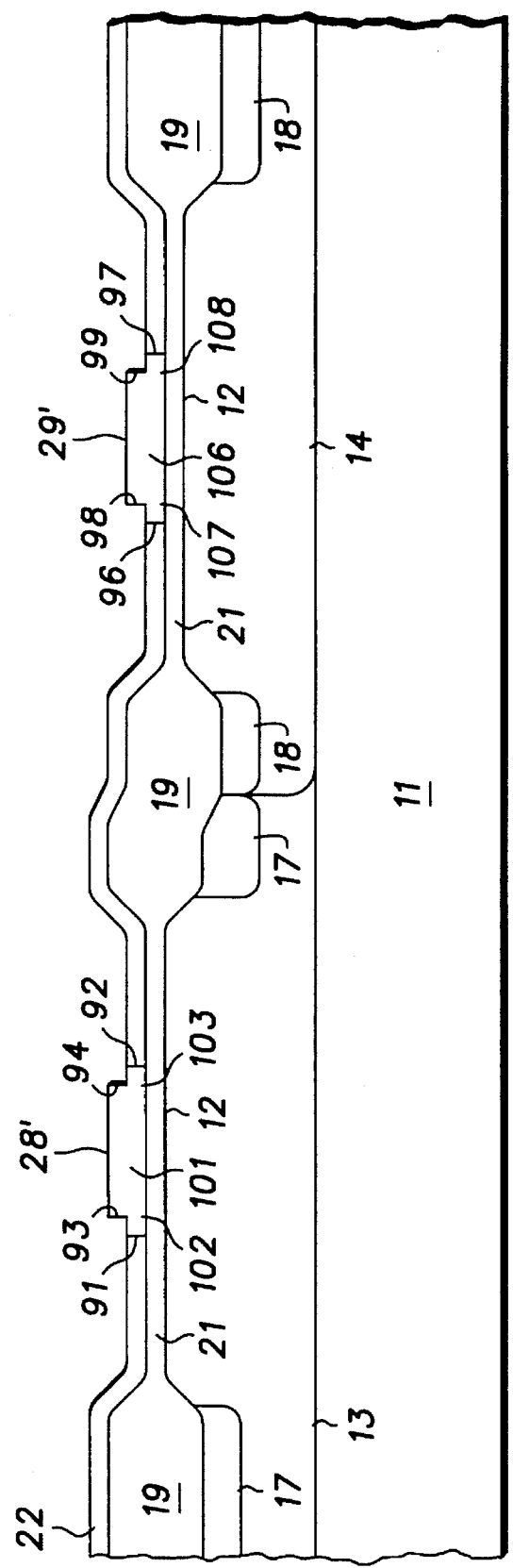

FIG. 13 illustrates an enlarged cross-sectional view of the portion of the partially completed low power insulated gate field effect transistor of FIG. 12 further along in processing. Oxide layer 23 is removed from gate electrode extension layer 22 using an isotropic etch.

Figure 14:
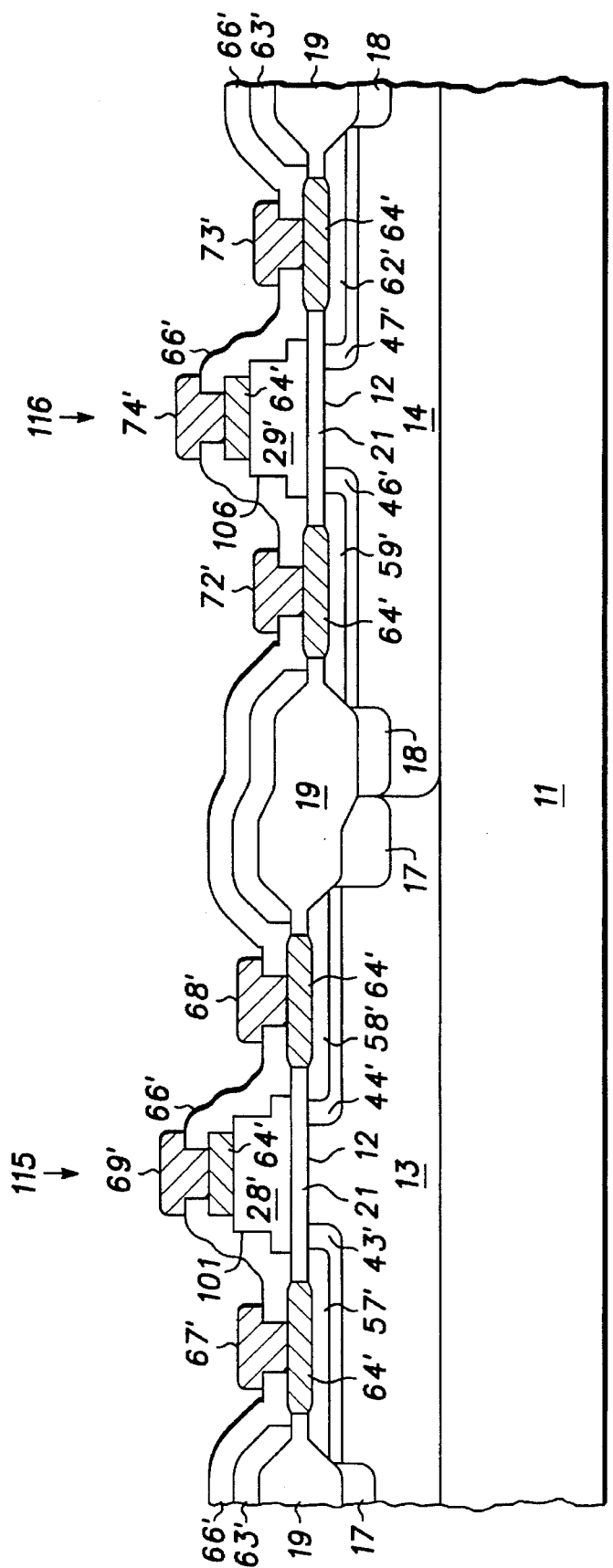
FIG. 14 illustrates an enlarged cross-sectional view of a portion of a bilateral insulated gate semiconductor device manufactured in accordance with the single-step gate extension embodiment of the present invention.

FIG. 14 illustrates an enlarged cross-sectional view of a portion of a bilateral low power insulated gate semiconductor device 121. Semiconductor device 121 is fabricated in accordance with the single-step gate extension embodiment of the present invention. It should be noted that the structure shown in FIG. 14 is similar to the structure shown in FIG. 4, the difference being that the gate electrode 28' of FIG. 13 is formed in a single step, whereas the gate electrode 28 of FIG. 4 is formed using multiple steps. Accordingly, bilateral semiconductor device 121 is fabricated using the same process steps as described with reference to FIGS. 5–7. A prime has been added to the elements of FIG. 14 that correspond to the elements illustrated in FIG. 7. Accordingly, electrodes are formed which contact first portion 101 of gate electrode 28', source region 57', and drain region 58' of N-channel field effect transistor 115 and first portion 106 of gate electrode 29', source region 59', and drain region 62' of P-channel field effect transistor 116. More particularly, openings (not shown) are formed in layer of dielectric material 63' to expose portions of source regions 57' and 59', portions of drain regions 58' and 62', and portions 101 and 106 of gate electrodes 28' and 29', respectively. Silicide 64' is formed on the exposed portions of regions 57', 58', 59', and 62' and on the exposed portions gate electrodes 28' and 29' An insulating layer 66' is formed on layer of dielectric material 63' and silicide 64'. A plurality of openings (not shown) are formed in insulating layer 66' to expose portions of silicide 64' on source regions 57' and 59', drain regions 58' and 62', and gate electrodes 28' and 29'. A source electrode 67' is formed to contact silicide 64' on source region 57', a drain electrode 68' is formed to contact silicide 64' on drain region 58', and a gate contact 69' is formed to contact silicide 64' on gate electrode 28' of N-channel insulated gate field effect transistor 115. Likewise, a source electrode 72' is formed to contact silicide 64' on source region 59', a drain electrode 73' is formed to contact silicide 64' on drain region 62', and a gate contact 74' is formed to contact silicide 64' on gate electrode 29' of P-channel insulated gate field effect transistor 116.

Figure 15:
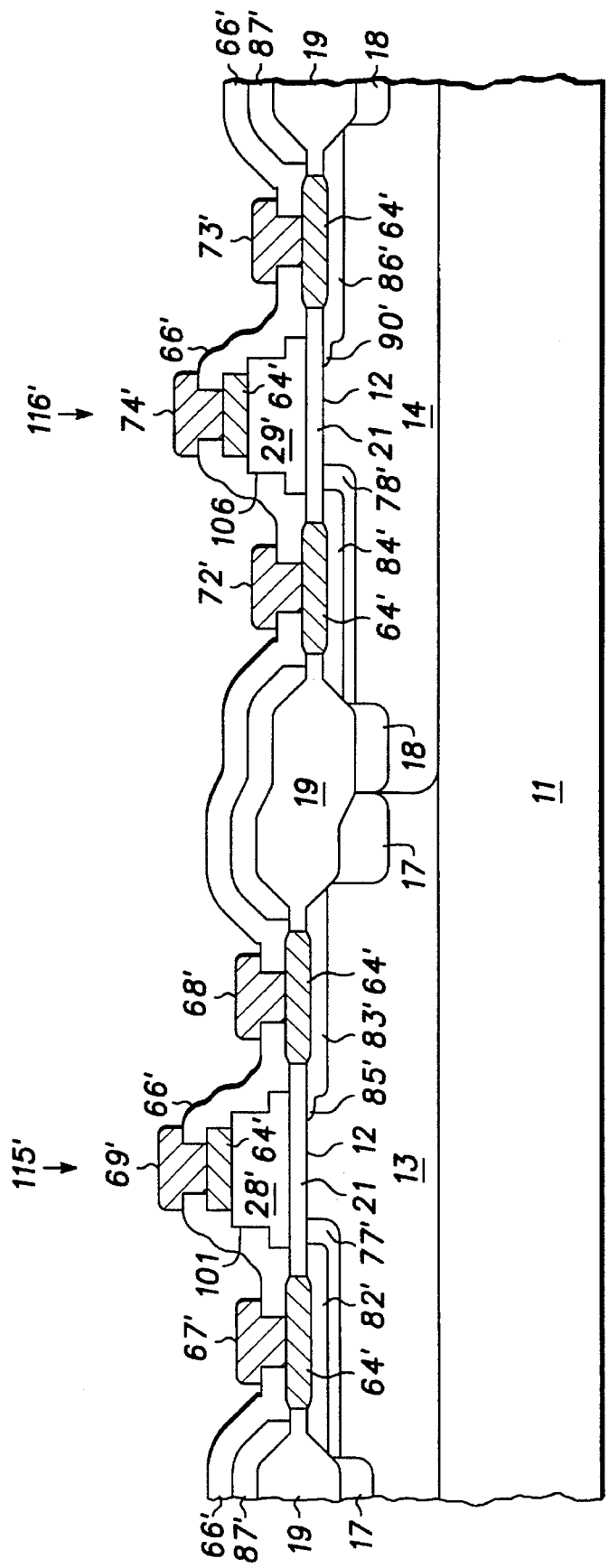
FIG. 15 illustrates an enlarged cross-sectional view of a portion of a unilateral insulated gate semiconductor device manufactured in accordance with the single-step gate extension embodiment of the present invention.

FIG. 15 illustrates an enlarged cross-sectional view of a portion of a unilateral low power insulated gate semiconductor device 124. Semiconductor device 124 is fabricated in accordance with the single-step gate extension embodiment of the present invention. It should be noted that the structure shown in FIG. 15 is similar to the structure shown in FIG. 10, the difference being that the gate electrode of FIG. 15 is formed in a single step, whereas the gate electrode of FIG. 10 is formed using multiple steps. Accordingly, unilateral semiconductor device 124 is fabricated using the same process steps as described with reference to FIGS. 8–10. A prime has been added to the elements of FIG. 15 that correspond to the elements illustrated in FIG. 10. Thus, electrodes are formed which contact first portion 101 of gate electrode 28', source region 82', and drain region 83' of N-channel field effect transistor 115' and first portion 106 of gate electrode 29', source region 84', and drain region 86' of P-channel field effect transistor 116'. More particularly, openings (not shown) are formed in layer of dielectric material 87' to expose portions of source regions 82' and 84' portions of drain regions 83' and 86', and portions 101 and 106 of gate electrodes 28' and 29', respectively. Silicide 64' is formed on the exposed portions of regions 77', 83', 84', and 86' and on the exposed portions gate electrodes 28' and 29'. An insulating layer 66' is formed on layer of dielectric material 87' and silicide 64'. A plurality of openings (not shown) are formed in insulating layer 66' to expose portions of silicide 64' on source regions 82' and 84', drain regions 83' and 86', and gate electrodes 28 and 28'. A source electrode 67' is formed to contact silicide 64' on source region 82', a drain electrode 68' is formed to contact silicide 64' on drain region 83', and a gate contact 69' is formed to contact silicide 64' on gate electrode 28' of N-channel insulated gate field effect transistor 115'. Likewise, a source electrode 72' is formed to contact silicide 64' on source region 84', a drain electrode 73' is formed to contact silicide 64' on drain region 86', and a gate contact 74' is formed to contact silicide 64' on gate electrode 29' of P-channel insulated gate field effect transistor 116'.

By now it should be appreciated that a method for forming insulated gate field effect transistors that improves control of the threshold voltage and increases source/drain to substrate breakdown voltages has been provided. An advantage of the present invention is that very shallow lightly doped source/drain extensions may be fabricated at the same time the source/drain regions are formed. The improvement in threshold voltage control results from the uniformly doped shallow region under the gate extension near the source region for the unilateral embodiment and near the source and drain regions for the bilateral embodiment. In addition, the present invention provides punchthrough protection by allowing the formation of deep halo regions.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, conventional LDD (lightly doped drain) source/drain structures may be included in the single-step and multi-step gate electrode embodiments. In particular, halo regions 77 and 78 of FIG. 9 may be formed at the source sides of transistors 15' and 16', while LDD structures are formed at the drain sides of these devices. In addition, graded channel regions may also be included.

We claim:

1. A method for manufacturing an insulated gate semiconductor device, comprising the steps of:

providing a semiconductor substrate of a first conductivity type and having a major surface;

forming a first layer of dielectric material on a portion of the major surface;

forming a gate electrode on a portion of the first layer of dielectric material by:

forming a gate extension layer on the first layer of dielectric material;

forming a second layer of dielectric material on the gate extension layer;

forming an opening in the second layer of dielectric material and the gate extension layer;

filling the opening with a conductive material, wherein a portion of the conductive material filling the opening serves as a first portion of the gate electrode;

removing the second layer of dielectric material;

forming a first spacer adjacent a first side of the first portion of the gate electrode and a second spacer adjacent a second side of the first portion of the gate electrode, wherein the first spacer covers a first portion of the gate extension layer and the second spacer covers a second portion of the gate extension layer, the first and second portions of the gate extension material serving as second and third portions of the gate electrode, respectively; and removing uncovered portions of the gate extension layer to form the second portion of gate electrode adjacent a first side of the first portion of the gate electrode and the third portion of the gate electrode adjacent a second side of the first portion of the gate electrode;

forming at least one dopant region of the first conductivity type after the step of removing the second layer of dielectric material wherein the at least one dopant region of the first conductivity type is aligned to the first side of the first portion of the gate electrode and extends into the semiconductor substrate;

forming first and second dopant regions of a second conductivity type, wherein the first dopant region of the second conductivity type is aligned to a side of the second portion of the gate electrode and extends into the semiconductor substrate and the second dopant region of the second conductivity type is aligned to a side of the third portion of the gate electrode and extends into the semiconductor substrate;

forming first and second electrodes, the first electrode in contact with the first dopant region of the second conductivity type and the second electrode in contact with the second dopant region of the second conductivity type; and forming a contact to the gate electrode.

2. The method of claim 1, wherein the step of forming a gate extension layer of the first layer of dielectric material includes forming a third layer of dielectric material which serves as the gate extension material.

3. The method of claim 2, wherein the third layer of dielectric material comprises silicon nitride and the second layer of dielectric material comprises oxide.

4. The method of claim 2, wherein the step of filling the opening with a conductive material includes filling the opening with a conductive material comprising polysilicon.

5. The method of claim 1, wherein the step of forming at least one dopant region of the first conductivity type includes implanting an impurity material of the first conductivity type through the gate extension layer second.

6. The method of claim 1, wherein the step of forming a gate extension layer of the first layer of dielectric material includes forming a layer of semiconductor material on the first layer of dielectric material, the layer of semiconductor material serving as the gate extension layer.

7. A method for fabricating an insulated gate semiconductor device, comprising the steps of:

providing a semiconductor substrate of a first conductivity type and having a major surface;

forming a first layer of dielectric material on a portion of the major surface;

depositing a material for extending a gate electrode on the first layer of dielectric material;

forming a second layer of dielectric material on the material for extending the gate electrode;

forming a cavity in material deposited for extending the gate electrode;

filling the cavity with a gate electrode material to form a first portion of a gate electrode, the first portion having first and second sides;

removing the second layer of dielectric material;

forming a first spacer adjacent the first side of the first portion of the gate electrode and a second spacer adjacent the second side of the first portion of the gate electrode wherein portions of the material for extending the gate electrode are exposed;

removing the exposed portions of the material for extending the gate electrode to form first and second gate electrode extensions;

doping a first portion of the semiconductor substrate with an impurity material of the first conductivity type, the first portion aligned to the first side of the first portion of the gate electrode;

doping a sub-portion of the first portion of the semiconductor substrate and a second portion of the semiconductor substrate with an impurity material of a second conductivity type, the sub-portion aligned to a side of the first gate electrode extension and the second portion of the semiconductor substrate aligned to a side of the second gate electrode extension;

forming first and second electrodes, the first electrode in contact with the sub-portion of the first portion of the semiconductor substrate and the second electrode in contact with the second portion of the semiconductor substrate; and forming a contact to the gate electrode.

8. The method of claim 7, wherein the step of depositing a material for extending a gate electrode includes depositing polysilicon.

9. The method of claim 8, wherein the steps of forming a cavity, filling the cavity, and forming spacers include laterally extending the cavity into the material for extending the gate electrode and exposing a portion of the first layer of dielectric material, filling the cavity with polysilicon which serves as a first portion of the gate electrode, isotropically etching the second layer of dielectric material to expose a side of the first portion of the gate electrode, forming the spacer adjacent the exposed side of the gate electrode, wherein portions of the material for extending the gate electrode between the spacer and the first layer of dielectric material serve as a second portion of the gate electrode.

10. The method of claim 7, wherein the step of forming a cavity in the second layer of dielectric material includes forming the cavity in a portion of the material for extending the gate electrode, wherein a portion of the cavity in the portion of the material for extending the gate electrode extends between the first layer of dielectric material and the second layer of dielectric material.

11. The method of claim 7, wherein the step of doping a first portion of the semiconductor substrate with an impurity material of the first conductivity type further includes doping a third portion of the semiconductor substrate with the impurity material of the first conductivity type.

12. A method for manufacturing an insulated gate semiconductor device, comprising the steps of:

providing a semiconductor substrate of a first conductivity type and having a major surface;

forming a first layer of dielectric material on a portion of the major surface;

forming a gate electrode on a portion of the first layer of dielectric material by:

forming a second layer of dielectric material on the first layer of dielectric material;

forming a third layer of dielectric material on the second layer of dielectric material, wherein the third layer of dielectric material is different from the second layer of dielectric material;

forming a cavity in the third layer of dielectric material and the second layer of dielectric material, wherein the cavity exposes a first portion of the first layer of dielectric material and extends between the third layer of dielectric material and at least a second portion of the first layer of dielectric material;

filling the cavity with a conductive material, wherein a portion of the conductive material filling the cavity serves as a first portion of the gate electrode;

removing the third layer of dielectric material, thereby forming the gate electrode comprising a second portion of the gate electrode adjacent a first side of the first portion of the gate electrode and a third portion of the gate electrode adjacent a second side of the first portion of the gate electrode;

forming at least one dopant region of the first conductivity type, wherein the at least one dopant region of the first conductivity type is aligned to the first side of the first portion of the gate electrode and extends into the semiconductor substrate;

forming first and second dopant regions of a second conductivity type, wherein the first dopant region of the second conductivity type is aligned to a side of the second portion of the gate electrode and extends into the semiconductor substrate and the second dopant region of the second conductivity type is aligned to a side of the third portion of the gate electrode and extends into the semiconductor substrate;

forming first and second electrodes, the first electrode in contact with the first dopant region of the second conductivity type and the second electrode in contact with the second dopant region of the second conductivity type; and forming a contact to the gate electrode.

13. The method of claim 12, wherein the step of forming a cavity includes laterally removing at least a portion of the second layer of dielectric material.

* * * * *

UNITED STATES PATENT AND TRADEMARK OFFICE
CERTIFICATE OF CORRECTION

PATENT NO. : 5,545,575
DATED : August 13, 1996
INVENTOR(S) : Shih K. Cheng et al.

It is certified that error appears in the above-indentified patent and that said Letters Patent is hereby corrected as shown below:

In claim 2, column 11, line 45, delete first occurrence of "of" and insert --on--.

In claim 5, column 11, line 57, delete "second".

In claim 6, column 11, line 59, delete first occurrence of "of" and insert --on--.

In claim 7, column 12, line 7, insert --the-- after "in".

In claim 7, column 12, line 16, insert --,-- after "electrode".

In claim 10, column 12, line 54, delete "a" and insert --the--, and delete "in the second layer of dielectric material".

In claim 10, column 12, line 55, delete "forming" and insert --laterally extended--, and delete "in a portion of" and insert --into--.

Signed and Sealed this

Sixteenth Day of December, 1997

Attest:

BRUCE LEHMAN

Attesting Officer

Commissioner of Patents and Trademarks